May 16, 1967 E. R. PHILLIPS 3,319,886
PURE FLUID BINARY COUNTER
Filed Oct. 21, 1965

INVENTOR
EDWIN R. PHILLIPS

BY Thomas P. Murphy

AGENT 3,319,886

PURE FLUID BINARY COUNTER

Edwin R. Phillips, Rosemont, Pa., assignor to Sperry Rand Corporation, New York, N.Y., a corporation of Delaware Filed Oct. 21, 1965, Ser. No. 500,137
16 Claims. (Cl. 235—201)

This invention relates to a binary counter and more particularly to a pure fluid binary counter.

The advantages of the pure fluid devices referred to in the art generically as fluid amplifiers are many and well known. They are simple and inexpensive to construct. They utilize no moving parts other than the fluid itself and are therefore virtually trouble-free in operation. No environmental limitations to their use in operation has yet been encountered, for example, they work well in conditions of extreme temperature variation, in high acceleration and vibration environments, as well as in radio-active environments.

The present invention contemplates a fluid binary counter incorporating all of the above-mentioned advantages. In addition the pure fluid binary counter of the present invention is an improvement over the pure fluid binary counters of the prior art in that the present invention requires only one active element for each counter stage. By the term "active element" is meant a fluid amplifier either utilizing the boundary effect which may be built into a fluid device or one which utilizes other means, for example, positive feedback to provide an equivalent effect.

Heretofore, in most pure fluid binary counters at least two active elements were required for each counter stage of the binary counter. The fluid binary counters of the prior art which utilized only one active element for each counter stage required such additional structure consisting both of fluid elements and fluid circuitry interconnecting the various elements as to be prohibitive both in cost and size.

The present invention makes possible a pure fluid binary counter which requires only one active element per counter stage and wherein complementary fluid circuitry is held to an absolute minimum.

More particularly, the present invention relates to a pure fluid binary counter which comprises a single fluid flip-flop per stage and wherein the fluid flip-flop has a small volume capacitance and fluid resistance in each output channel. Thus when the flip-flop is turned off and then immediately turned on, the lingering back pressure in the small volume causes the flip-flop to switch to the previously off output. Each time the flip-flop power is interrupted, the flip-flop changes state. Furthermore, the use of the present invention minimizes power consumption and the output channels of the active element of one binary counter stage serve as the input to the second binary counter stage without need for a source of control fluid.

The present invention further comprises input fluid circuitry in combination with the binary counter for providing input pulses with the proper off time.

Other advantages of the present invention will become more readily apparent with the reading of the specification in conjunction with the attached drawings.

Figure 1:
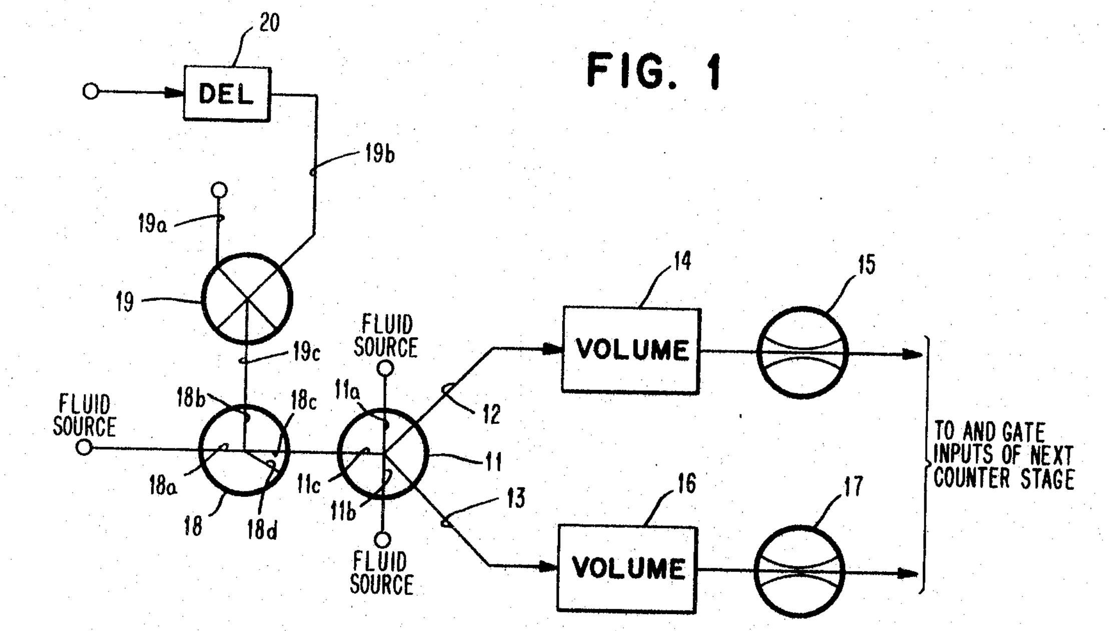
FIGURE 1 illustrates in schematic form a preferred embodiment of the present invention.

Referring now more particularly to FIGURE 1 there is shown a fluid amplifier 11 of the type utilizing the phenomena of "lock-on" or "boundary layer effect." Thus, fluid amplifier or flip-flop 11 is of a type well known in the prior art. Considered alone fluid amplifier 11 functions to maintain a power stream applied at its input channel in one or the other of its two output channels 12 or 13. In other words, if the power fluid in the form of a power stream is directed through the output channel 12, it remains there until some external force sufficient to overcome the attractive force between the power stream and the wall of the output channel 12 is appropriately applied to the amplifier 11. For example, a fluid control signal of sufficient force applied to the control channel 11*a* would cause the power stream to switch to the output channel 13. Similarly, a control signal applied at the control channel 11*b* would switch a power stream from the output channel 13 to the output channel 12.

However, it should be noted that the fluid amplifier or flip-flop 11 as used in this invention is not reliant on the control channels 11*a* or 11*b* for switching. Thus, the control channels 11*a* or 11*b* are unnecessary to the present invention and are shown only as an extra control means which may, if desired, be used as an over-riding set or reset control.

Disposed in the output channel 12 is a small volume or fluid capacitance 14 followed by a fluid restriction or resistance 15. In a similar fashion the output channel 13 has disposed therein a fluid capacitance 16 and fluid resistance 17.

When the input channel 11*c* of the fluid flip-flop 11 is connected to a source of fluid power and the power stream is in the output channel 12, the capacitive volume 14 increases in pressure at a rate determined by the size of the capacitive volume 14 and the size of the fluid resistance 15. When the fluid power source is disconnected from the input channel 11*c* and then immediately reconnected thereto, the lingering back pressure in the capacitive volume 14 causes the power stream to divert to the output channel 13. When the power fluid is again disconnected from the input channel 11*c* and then immediately reconnected thereto, the power stream is diverted back into the output channel 12 due to the lingering back pressure in the capacitive volume 16.

The length of time during which the lingering back pressure in capacitive volumes 14 or 16 is effective to switch the flip-flop 11 is a function of the time constant of the sizes of the capacitive volume 14 and resistance 15 or the capacitive volume 16 and the resistance 17 in a way analogous to the RC time constant of an electronic circuit.

The fluid circuitry for applying pulses to the input channel 11*c* of the fluid flip-flop 11 providing a controlled off time is discussed below. A fluid inverter 18 has an output channel 18*c* connected to the input channel 11*c* of the fluid flip-flop 11 and an output channel 18*d* connected to the ambient which would normally be the atmosphere. Thus, when source of power fluid is connected to the input channel 18*a* of the fluid inverter 18, that source of power fluid is normally connected to the input channel 11*c* of the fluid flip-flop 11. When, however, the control channel 18*b* of the fluid inverter 18 is provided with a fluid pulse, the power stream from the power source connected to the input channel 18*a* is diverted to the output channel 18*d* thereby removing power from the input channel 11*c*.

An AND gate 19 has its output channel 19*c* connected to the control channel 18*b* of the fluid inverter 18. The AND gate 19 has two input channels 19*a* and 19*b*. Disposed within the input channel 19*b* is a fluid delay line 20. Whenever fluid power streams are simultaneously present in the input channels 19*a* and 19*b*, the AND gate 19 has an output at its output channel 19*c* which, of course, disconnects the power source from the input channel 11*c* of the fluid flip-flop 11.

The input channels 19*a* and 19*b* of the AND gate 19 are respectively connected to the output channels of the preceeding counter stage.

Figure 2:
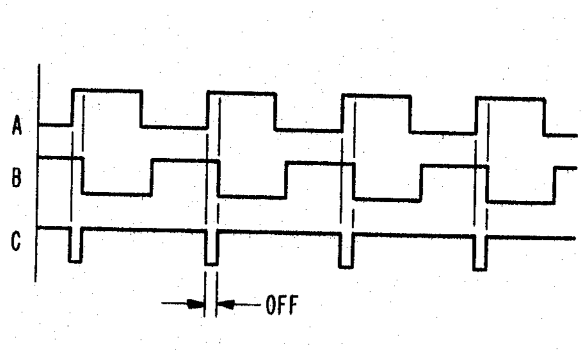
FIGURE 2 illustrates the pulse wave forms associated with the pulse forming circuitry of the present invention.

The operation of the fluid pulse forming circuitry is best understood by reference to FIGURE 2. Waveform B of FIGURE 2 represents the input to input channel 19*b* of the AND gate 19 after passing through the delay line 20. Waveform A represents the input to the input channel 19*a* of the AND gate 19. Waveform C represents the output at the output channel 18*c* of the fluid inverter 18 or the input to the input channel 11*c* of the fluid flip-flop 11.

If it were not for the fluid delay line 20 disposed in the input channel 19*b* of the AND gate 19, the fluid pulses represented by waveforms A and B would be precisely 180° out of phase. Thus, if it were not for delay line 20 the AND gate 19 would never have an output on its output channel 19*c*. However, by virtue of the delay line 20 introducing a small delay in the fluid pulse reaching the AND gate 19 on the input channel 19*b* there is a short time during which there is a coincidence in time of fluid pulses applied to the input channels 19*a* and 19*b*. During this time of coincidence the AND circuit 19 has an output on its output channel 19*c*. Therefore, the inverter 18 has an input signal on its control channel 18*b*. The negative going pulses of waveform C represent the time that the control channel 18*b* has an input pulse because it is during this time that the fluid inverter 18 is off, that is, the power stream is diverted to atmosphere through the output channel 18*d*.

By this means the fluid power normally connected to the flip-flop 11 is momentarily interrupted. The off time of the inverter is controlled and may be predetermined by the size of the delay induced by the fluid delay line 20. Once the maximum off time for the pulses applied to the input channel 11*c* which is effective to cause the fluid flip-flop 11 to function as a binary counter is determined, the size of fluid delay line 20 is also determined.

The output channels 12 and 13 may be connected to the respective input channels of the AND gate in the next counter stage or to some other utilization device if the counter stage illustrated in the drawing is the last of the stages.

The embodiments of the invention in which an exclusive property or privilege is claimed are defined as follows:

1. A fluid binary counter, comprising in combination: a fluid bi-stable device having a main power input channel for powering said bi-stable device and first and second output channels, each of said output channels including a fluid capacitance and a fluid resistance, each said fluid capacitance and resistance providing a fluid circuit having a predetermined time constant, pulse source means connected to said main power input channel providing said bi-stable device with fluid pulses separated by intervals which are short in comparison to the time constants of either of said fluid circuits.

2. A binary counter according to claim 1 wherein said fluid bi-stable device is a fluid amplifier of the boundary layer type.

3. A binary counter according to claim 1 wherein said fluid capacitance comprises a chamber of predetermined volume and said fluid resistance comprises a restriction of predetermined size.

4. A binary counter according to claim 2 wherein said fluid capacitance comprises a chamber of predetermined volume and said fluid resistance comprises a restriction of predetermined size.

5. A fluid binary counter, comprising in combination; a fluid bi-stable device having an input channel and first and second output channels, each of said output channels including a fluid capacitance and a fluid resistance, pulse source means connected to said input channel providing said bi-stable device with fluid pulses separated by intervals which are a function of the size of said fluid capacitance and resistance and wherein said pulse source means comprises, a fluid power source, means normally connecting said fluid power source to said input channel of said fluid bi-stable device, and control means connected to the last-named means periodically disconnecting said fluid power source from said input channel of said bi-stable device for a predetermined period of time.

6. A binary counter according to claim 5 wherein said fluid bi-stable device is a fluid amplifier of the boundary layer type.

7. A binary counter according to claim 5 wherein said fluid capacitance comprises a chamber of predetermined volume and said fluid resistance comprises a restriction of predetermined size.

8. A binary counter according to claim 6 wherein said fluid capacitance comprises a chamber of predetermined volume and said fluid resistance comprises a restriction of predetermined size.

9. A binary counter according to claim 5 wherein said means normally connecting said fluid power source to said input channel is a fluid inverter having an input channel, a control channel and first and second output channels, said power source normally being connected to said input channel of said bi-stable device, and said control means comprises a fluid AND gate having a pair of input channels and an output channel connected to said control channel of said inverter.

10. A binary counter according to claim 6 wherein said means normally connecting said fluid power source to said input channel is a fluid inverter having an input channel, a control channel and first and second output channels, said power source normally being connected to said input channel of said bi-stable device, and said control means comprises a fluid AND gate having a pair of input channels and an output channel connected to said control channel of said inverter.

11. A binary counter according to claim 7 wherein said means normally connecting said fluid power source to said input channel is a fluid inverter having an input channel, a control channel and first and second output channels, said power source normally being connected to said input channel of said bi-stable device, and said control means comprises a fluid AND gate having a pair of input channels and an output channel connected to said control channel of said inverter.

12. A binary counter according to claim 8 wherein said means normally connecting said fluid power source to said input channel is a fluid inverter having an input channel, a control channel and first and second output channels, said power source normally being connetced to said input channel of said bi-stable device, and said control means comprises a fluid AND gate having a pair of input channels and an output channel connected to said control channel of said inverter.

13. A binary counter according to claim 9 wherein said control means includes a fluid delay line in one of the input channels of said AND gate with the length of delay therein being related to the size of said fluid capacitance and said fluid resistance.

14. A binary counter according to claim 10 wherein said control means includes a fluid delay line in one of the input channels of said AND gate with the length of delay therein being related to the size of said fluid capacitance and said fluid resistance.

15. A binary counter according to claim 11 wherein said control means includes a fluid delay line in one of the input channels of said AND gate with the length of delay therein being related to the size of said fluid capacitance and said fluid resistance.

16. A binary counter according to claim 12 wherein said control means includes a fluid delay line in one of the input channels of said AND gate with the length of delay therein being related to the size of said fluid capacitance and said fluid resistance.

References Cited by the Examiner

UNITED STATES PATENTS

| | | | |
|---|---|---|---|
| 3,191,611 | 6/1965 | Bauer | 235—201 X |
| 3,199,781 | 8/1965 | Welsh | 235—201 |
| 3,227,368 | 1/1966 | Jacoby | 235—201 |

OTHER REFERENCES

Hobbs, "9 Logic Elements," Fluid Amplification Symposium, U.S. Army Command, Harry Diamond Laboratories, Mar. 8, 1963. Pp. 14 and 19.

Norwood, "Generating Timed Pneumatic Pulses," IBM Technical Disclosure Bulletin, vol. 5, No. 9, February 1963. Pp. 13 and 14.

RICHARD B. WILKINSON, *Primary Examiner.*

STEPHEN J. TOMSKY, *Examiner.*

L. R. FRANKLIN, *Assistant Examiner.*